United States Patent [19]

Araki et al.

[11] Patent Number: 5,305,337
[45] Date of Patent: Apr. 19, 1994

[54] LASER CONTROLLER

[75] Inventors: Yoshiyuki Araki; Hiroto Watanabe, both of Tokyo, Japan

[73] Assignee: Asahi Kogaku Kogyo Kabushiki Kaisha, Tokyo, Japan

[21] Appl. No.: 847,278

[22] Filed: Mar. 10, 1992

[30] Foreign Application Priority Data

Mar. 15, 1991 [JP] Japan ............................ 3-022921[U]

[51] Int. Cl.5 .................................................. H01S 3/10
[52] U.S. Cl. .......................................... 372/31; 372/29; 372/38
[58] Field of Search ............................ 372/29, 31, 38

[56] References Cited

U.S. PATENT DOCUMENTS

| 4,727,382 | 2/1988 | Negishi et al. | 346/108 |
|---|---|---|---|
| 4,802,179 | 1/1989 | Negishi | 372/38 |
| 4,879,459 | 11/1989 | Negishi | 250/205 |
| 5,018,154 | 5/1991 | Ohashi | 372/33 |

Primary Examiner—James W. Davie
Attorney, Agent, or Firm—Sandler, Greenblum & Bernstein

[57] ABSTRACT

A laser beam controller having a laser beam emitter for emitting a laser beam and a beam receiver which receives the laser beam emitted from the laser beam emitter and outputs a light receipt signal corresponding to a signal level of the laser beam. The laser controller includes a reference signal outputting device for outputting a reference signal in accordance with an environmental humidity of the laser controller. A comparator compares the light receipt signal of the light receiver with the references signal. A control device controls the output of the laser beam emitter in accordance with the comparison result of the comparator.

17 Claims, 2 Drawing Sheets

LASER CONTROLLER

BACKGROUND OF THE INVENTION

1. Field of the Invention

The present invention is directed to an apparatus for controlling the power of a laser beam in a laser scanner that is used in an electrophotographic apparatus, such as a laser printer.

2. Description of Related Art

In a known electrophotographic apparatus, such as a laser printer, an image is usually printed on recording paper in accordance with image data fed from the outside, as follows:

A laser beam emitted from a laser diode (LD) in accordance with the image data is made incident upon a peripheral surface of a polygonal mirror that rotates at a predetermined constant speed. The laser beam reflected by the polygonal mirror is then made incident upon a surface of a photosensitive drum, which also rotates at a predetermined constant speed, so that the potential of the surface portion of the photosensitive drum illuminated with the laser beam drops, and the quantity of charged toner corresponding to the potential of the photosensitive drum surface is attracted to the surface portion of the photosensitive drum on which the potential drop takes place.

Thereafter, a recording paper that has been subjected to a corona charging comes into contact with the drum surface of the photosensitive drum that has a toner attracted thereon, so that the toner is transferred to the recording paper to print an image on the recording paper in accordance with the image data.

The laser head (laser diode) and the polygonal mirror are usually united to form a laser scanner. Referring to FIG. 3, the laser beam emitted from laser diode 1 is partly received by a photodiode 2 that is located in the vicinity of the LD 1 and which is connected to an inverting input terminal of a differential amplifier 3 and one end of a variable resistor Rm. The other end of the variable resistor Rm is connected to a non-inverting input terminal of the differential amplifier 3.

The output of the differential amplifier 3 is input to a non-inverting input terminal of a comparator 4. A constant voltage source 5 is connected to an inverting input terminal of the comparator 4 to define a reference voltage Vref of the laser beam. A HIGH level signal "H" or a LOW level signal "L" of the comparator 4 which represents the comparison result of the voltages between the inputted terminals thereof is input to a central processing unit (CPU) 6.

The CPU 6 outputs power data to a digital-analogue converter (D/A converter) 7. The power data increases or decreases the power of the laser diode 1 until the signal outputted by the comparator 4 is inverted, when the output signal of the comparator 4 is "L" or "H", respectively. The power data converted by the D/A converter 7 is sent to the laser diode 1 through a current source 8, in which the voltage is converted to an electric current, and a switch 9.

When the external image data VIDEO is input to the switch 9, the laser diode 1 is supplied with the electric current from the current source 8.

A light emission permitting signal ENABLE is input from the outside to the current source 8 to permit the laser diode 1 to be supplied with electric current.

In the conventional laser scanner, as constructed above, the laser beam emitted from the laser diode 1 is received by the photodiode 2, so that an electric current produced by the photodiode 2 is supplied to the variable resistor Rm. Consequently, a potential difference Vm in proportion to the power of the laser beam is produced between the opposite ends of the variable resistor Rm, so that the signal representing the laser beam power is input to the comparator 4 from the differential amplifier 3.

Upon assembling the laser beam scanner, the power of the laser diode 1 is adjusted to a predetermined value. In the adjusting operation, the resistance of the variable resistor Rm is adjusted to make the potential difference Vm coincidental with the reference voltage Vref defined by the constant voltage source 5, while monitoring the output of the differential amplifier 3. After the adjustment of the resistance of the variable resistor Rm is completed, the resistance is fixed, and the variable resistor Rm is accommodated in a housing of the laser beam scanner.

When the laser beam scanner is incorporated in, for example, a laser printer or the like (not shown), the current supplied from the current source 8 (i.e., the analogue power data converted by the D/A converter 7) is gradually increased from zero by the control of the CPU 6, thereby varying the power of the laser diode 1. The power is then input as a potential difference Vm to the non-inverting input terminal (+) of the comparator 4 through the differential amplifier 3.

When the output of the comparator 4 in which the potential difference Vm is compared with the reference voltage Vref defined by the constant voltage source 5 is inverted from "L" to "H", the CPU 6 stops increasing the power data. Thus, the laser beam power can be automatically controlled.

The automatic power control is effected in accordance with the input timing of a timing signal SAMPLE from outside into the CPU 6. The timing signal SAMPLE is usually a pulse signal which is outputted at a cycle corresponding to one line of an image or one or a few pages of image represented by the image data VIDEO. Accordingly, the automatic power control is carried out so that when the timing signal SAMPLE is "L", namely, when no image is scanned, the laser beam power is at a predetermined value.

Note that the automatic power control is effected when the timing signal SAMPLE is input to the CPU 6 during the emission of the laser beam, namely, in accordance with need.

In an electrophotographic apparatus, such as a laser printer, the print density varies depending on the environmental condition, including humidity or temperature, etc. For instance, when the humidity increases, the quantity of charged toner decreases, and accordingly, the amount of toner transferred onto the recording paper is increased, thereby increasing the print density.

To prevent this, it is desirable that the operator can easily adjust the power of the laser beam in equipment that has already been installed. However, in the prior art, the power of the laser beam is adjusted only by adjusting the resistance of the variable resistor Rm, which is usually a trimmer, and accordingly, to adjust the power of the laser beam after the laser scanner is installed in, for example, a laser printer, it is necessary to first disassemble the laser beam scanner from the laser printer and then open the housing thereof so that the resistance of the variable resistor Rm may be adjusted. These operations are rather troublesome.

Furthermore, since the conventional automatic power control is realized by the comparison of the potential difference Vm, proportional to the power of the laser beam, and the fixed reference voltage Vref defined by the voltage source 5, it is impossible to adjust the print density depending on the environmental condition.

SUMMARY OF THE INVENTION

A primary object of the present invention is to provide a laser power control apparatus in which the power of the laser beam can be easily adjusted by the operator even after it is incorporated in a laser printer or the like.

To achieve the object of the invention mentioned above, according to the present invention, there is provided a laser controller that includes a laser beam emitting means for emitting a laser beam and a beam receiving means which receives the laser beam emitted from the laser beam emitting means and which outputs a light receipt signal corresponding to a signal level of the laser beam, a reference signal outputting means for outputting a reference signal in accordance with an environmental humidity of the laser controller, a comparing means for comparing the light receipt signal of the light receiving means and the reference signal, and a control means for controlling the output of the laser beam emitting means in accordance with the comparison result of the comparing means.

According to another aspect of the present invention, there is provided an apparatus for controlling the power of a laser beam, comprising a laser beam emitting means for outputting a laser beam, a driving means for supplying the laser beam emitting means with an electric current, a light receiving means for receiving the laser beam emitted from the laser beam emitting means to produce an output corresponding to the power of the laser beam, a comparing means for comparing the output of the light receiving means corresponding to the power of the laser beam and a predetermined reference voltage, a reference voltage adjusting means for adjusting the reference voltage, and a control means for controlling the driving means in accordance with the comparison result of the comparing means and varying the electric current which is to be supplied to the laser beam emitting means from the driving means.

The present disclosure relates to subject matter contained in Japanese Utility Model Application No. HEI 3-22921 (filed on Mar. 15, 1991), which is expressly incorporated herein by reference in its entirety.

BRIEF DESCRIPTION OF THE DRAWINGS

The invention will be described below in detail with reference to the accompanying drawings, in which.

DESCRIPTION OF THE PREFERRED EMBODIMENTS

Figure 1:
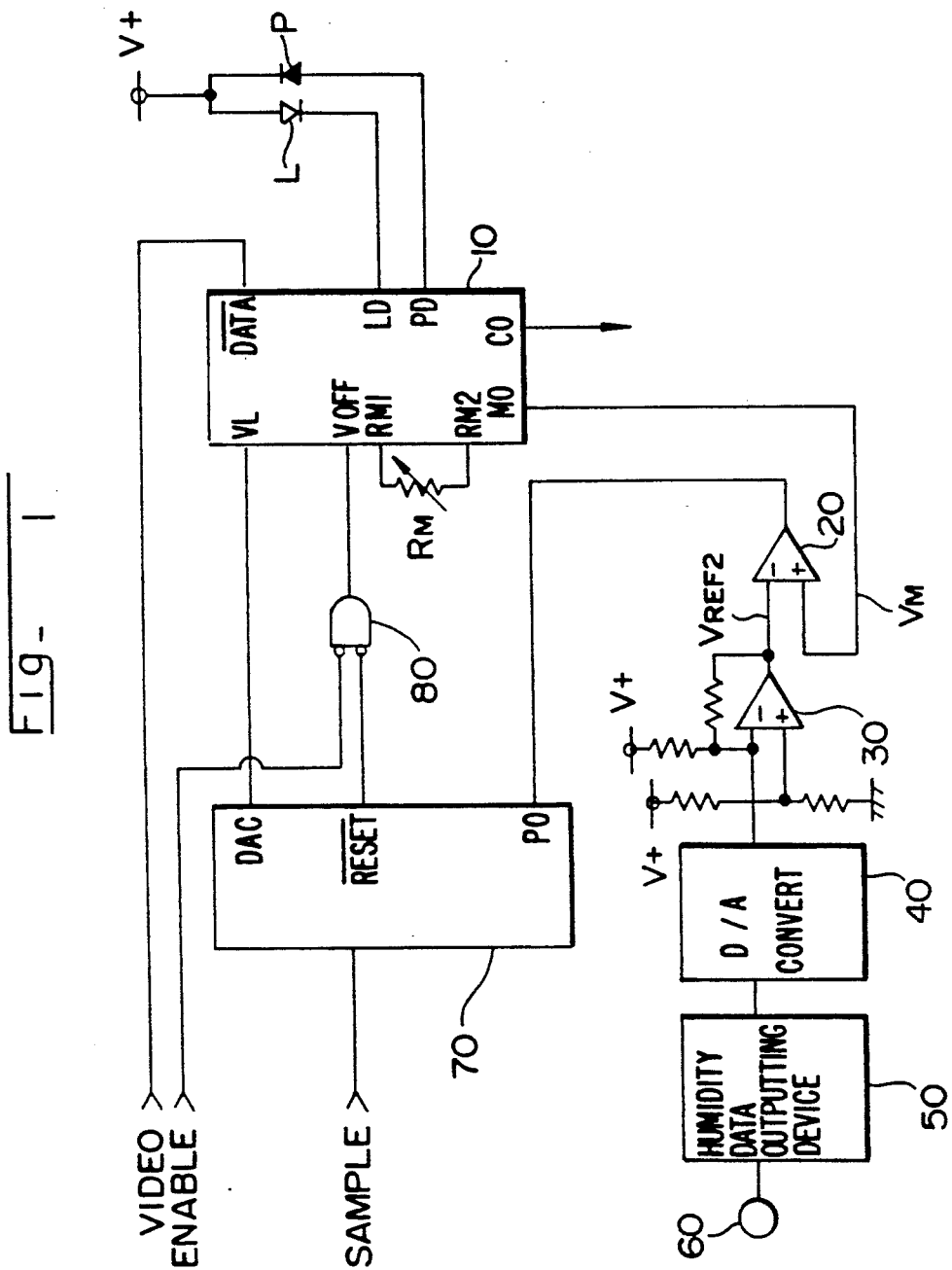
FIG. 1 is a block diagram of a circuit of a laser scanner having a power control apparatus according to the present invention.

In FIG. 1, which shows a circuit diagram of a laser scanner having a power control apparatus according to an embodiment of the present invention, L designates a laser diode that operates as a laser emitting means for emitting laser beams, and P designates a photodiode (light receiving means) that is located in the vicinity of the laser diode L to thereby receive the laser beams and produce an electric current that is proportional to the power of the laser diode L.

The laser diode L and the photodiode P are connected to a laser diode connecting port LD and a photodiode connecting port PD of a laser driving integrated circuit (IC) 10, respectively.

Figure 2:
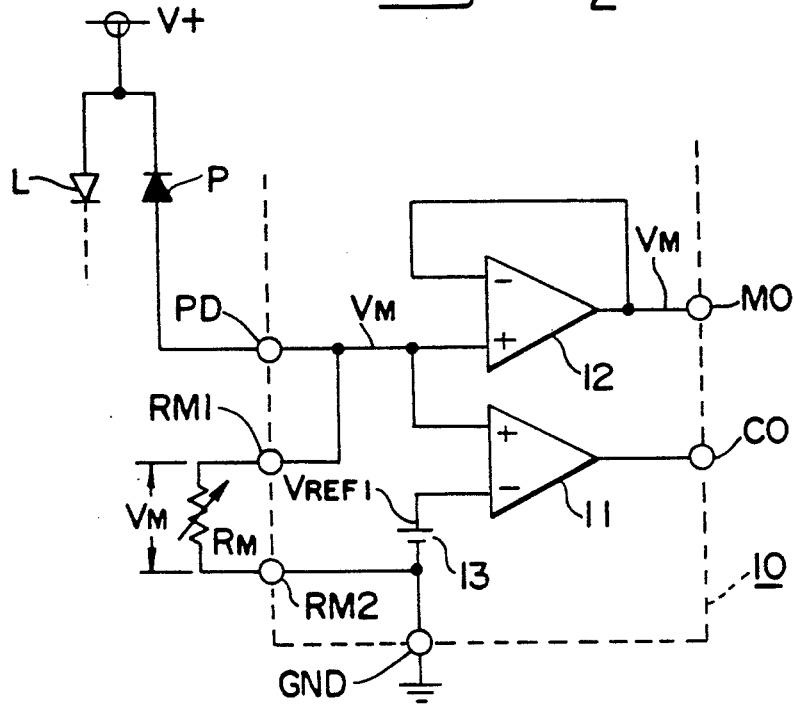
FIG. 2 is a block diagram of a laser driving IC in the laser scanner shown in FIG. 1; and, FIG. 3 is a block diagram of a circuit of a known laser scanner having a power control apparatus.
Figure 3:
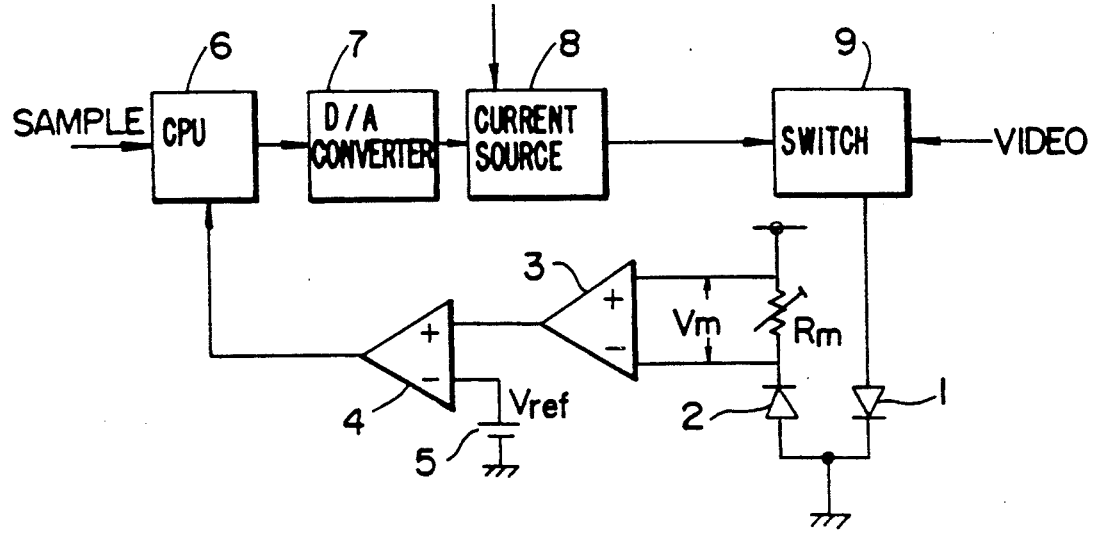

The main components of the laser driving IC 10, including the photodiode connecting port PD, are shown in FIG. 2. In FIG. 2, the photodiode connecting port PD is connected to the non-inverting input port of a comparator 11, one end of a connecting port of a variable resistor $R_M$ (RM1) being adapted to adjust the power of the laser beam upon manufacturing of the laser scanner, and a non-inverting input terminal of an operation amplifier (buffer) 12 that is adapted to obtain a precise output in proportion to the power of the laser beams.

An inverting input terminal of comparator 11 is connected to a positive (+) terminal of a constant voltage source 13 that defines a reference voltage $V_{REF1}$ of the laser beam when the laser beam power of the laser diode L is adjusted upon manufacturing thereof. The output of the operation amplifier 12 is fed back to an inverting input terminal thereof. A negative (−) terminal of the constant voltage source 13 and connecting port RM2 of the variable resistor $R_M$ are connected to a grounding port GND.

A potential difference that is produced between the opposite ends of the variable resistor $R_M$ when the photodiode P receives the laser beam and produces the electric current is input as a signal representing the power of the laser diode L to the non-inverting input terminal of the comparator 11 and the non-inverting input terminal of the operation amplifier 12.

The output signal of the comparator 11 (i.e., the result of the comparison of $V_M$, representing the power of the laser beam, and the reference voltage $V_{REF1}$) is adjusted at the manufacturing stage to meet a predetermined value corresponding to a predetermined laser beam power. The output signal is then sent to an external monitor (not shown), through a comparator output port CO of the laser driving IC 10. The potential difference $V_M$, which is proportional to the laser beam power and which is output from the operation amplifier 12, is sent to the non-inverting input terminal of comparator 20 (comparing means) shown in FIG. 1 through a monitor signal output port MO of the laser driving IC 10.

A second reference voltage $V_{REF2}$ output from an operational amplifier 30 is input to an-inverting input terminal of comparator 20 to adjust the laser beam power during laser-printing. In the illustrated embodiment, the laser power is adjusted in accordance with the ambient humidity of the laser printer, and accordingly, the second reference voltage $V_{REF2}$ varies with humidity. The second reference voltage $V_{REF2}$ is controlled by a reference signal control means which is constituted by a humidity sensor 60, a humidity data outputting device 50, a D/A converter 40, and the operational amplifier 30.

An output terminal of the humidity data outputting device 50 is connected to an input terminal of the D/A converter 40. The humidity sensor 60, which detects the ambient humidity and outputs a corresponding electric signal, is connected to an input terminal of the humidity data outputting device 50. The humidity data outputting device 50 outputs the laser beam power controlling digital signal to the D/A converter 40 to control the laser beam power in accordance with the humidity of the humidity sensor 60. The D/A converter 40 outputs a reference voltage defining the second reference voltage $V_{REF2}$ to the inverting input terminal of the operation amplifier 30.

As mentioned above, comparator 20 compares the potential difference $V_M$, corresponding to the laser beam power, and the second reference voltage $V_{REF2}$. If the potential difference $V_M$ is larger than the second reference voltage $V_{REF2}$ ($V_M > V_{REF2}$), namely, if the laser beam power is above a predetermined reference level, comparator 20 outputs a signal "H". Conversely, if the potential difference $V_M$ is smaller than the second reference voltage $V_{REF2}$ ($V_M < V_{REF2}$), namely, if the laser beam power is below the reference level, comparator 20 outputs a signal "L". The level signal "H" or "L" is input to a microcomputer 70 as a control means through an input port PO thereof.

When the output of the comparator 20 is "H", the beam power is too intensive, and the microcomputer 70 gradually decreases the power data to thereby decrease the output level of the laser driving IC 10 (level of the laser diode L) until the output of the comparator 20 is inverted to "L". Conversely, when the output of the comparator 20 is "L", the beam power is too weak, and the microcomputer 70 gradually increases the power data to thereby increase the output level of the laser driving IC 10 (level of the laser diode L) until the output of the comparator 20 is inverted to "H".

The microcomputer 70 sends the output thereof to the laser driving IC 10 through a D/A converter (not shown), in which the power data is stored, and a D/A converter output port DAC. The laser driving IC 10 outputs a current to the laser diode L corresponding to the power data and the laser diode L in turn emits a laser beam of corresponding power.

The power data is input from the microcomputer 70 to a power data input port VL of the laser driving IC 10, so that the laser driving IC 10 converts the power data (voltage) to a current (voltage/current conversion) and outputs the driving current to the laser diode L to drive the latter. The laser driving IC 10 supplies the laser diode L with the driving current through the laser diode connecting port LD when an external image data signal VIDEO is input to the laser driving IC 10 through a data input port $\overline{DATA}$.

The microcomputer 70 outputs a reset signal through a reset signal output port $\overline{RESET}$ thereof when the microcomputer is reset. The reset signal $\overline{RESET}$ is inputted to a NAND circuit 80, together with a light emission permission signal ENABLE.

The output of the NAND circuit 80 is input to a reset signal input port $V_{OFF}$ of the laser driving IC 10, so that the laser driving IC 10 determines whether the driving current should be supplied to the laser diode L in accordance with the input signal level from the NAND circuit 80.

The power adjustments in a laser scanner having a laser power adjusting apparatus according to the present invention, at the time of manufacture of the laser scanner and after the laser scanner is incorporated in a laser printer, are effected as follows:

Upon assembling the laser scanner, the resistance of the variable resistor $R_M$ proportional to the laser beam power is adjusted to make the potential difference $V_M$ coincidental with the first reference voltage $V_{REF1}$ defined by the constant voltage source 13, while monitoring the output of the operation amplifier 12. After the adjustment is finished, the resistance of the variable resistor $R_M$ is fixed, and the variable resistor $R_M$ is incorporated together with other components in a laser scanner housing to produce a laser scanner.

After the laser scanner is incorporated in, for example, a laser printer, the power adjustment can be effected as follows during the operation of the laser printer:

The humidity data outputting device 50 has a memory (not shown) in which a table showing humidity values and 8-bit power control digital signals to obtain the second reference voltage $V_{REF2}$ corresponding to the humidity values is stored to vary the power of the laser diode L in accordance with the humidity values detected by the humidity sensor 60.

For example, the table stores therein the power control digital signal data, such as "10000000" corresponding to the first reference voltages $V_{REF1}$, so that the second reference voltage $V_{REF2}$ output from the operation amplifier 30 can be made coincidental with the first reference voltage $V_{REF1}$ when the ambient humidity of the laser printer is identical to the humidity obtained during the power adjustment upon assembling the laser scanner (which will be referred to as a reference humidity hereinafter).

Furthermore, according to the data stored in the table, the value of the power control digital signal is varied one increment by one increment and one decrement by one decrement when the ambient humidity increases and decreases from the reference humidity, respectively.

The power control digital signal of "10000000" corresponding to the first reference voltages $V_{REF1}$ is output from the humidity data outputting device 50 to the D/A converter 40, on the assumption that the ambient humidity is identical to the reference humidity at the commencement of the operation of the laser printer.

If the ambient humidity is different from the reference humidity, the power control digital signal corresponding to the difference between the ambient humidity and the reference humidity is output from the humidity data outputting device 50 to the D/A converter 40.

The D/A converter 40 to which the power control digital signal is input, converts the digital signal to an analogue signal which is then input to the inverting input terminal of the operation amplifier 30. When the power control digital signal is identical to the initial value "10000000", the output of the operation amplifier 30, i.e., the second reference voltage $V_{REF2}$ is identical to the first reference voltage $V_{REF1}$, and accordingly, the power is not changed.

If the power control digital signal differs from the initial value "10000000", the output of the D/A converter 40 changes, so that the second reference voltage $V_{REF2}$ output from the operation amplifier 30 becomes higher or lower than the first reference voltage $V_{REF1}$.

A change in the second reference voltage $V_{REF2}$, with which the potential difference $V_M$, is to be compared in the comparator 20, causes the latter to output the signal "L" or "H" to the input port PO of the microcomputer 70 when the second reference voltage $V_{REF2}$ is higher or lower than the first reference voltage $V_{REF1}$, respectively.

Consequently, the microcomputer 70 outputs the modified power data (increased or decreased power data which is correspondingly larger or smaller than the present values) to increase or decrease the output of the laser diode L to the laser driving IC 10 through the built-in D/A converter (not shown) and the D/A converter output port DAC thereof when the second reference voltage $V_{REF2}$ is higher or lower than the first reference voltage $V_{REF1}$, respectively.

When the potential difference $V_M$ representing the power of the laser diode L which varies in accordance with the power data is coincidental with the increased or decreased second reference voltage $V_{REF2}$, so that the output of the comparator 20 is inverted, the increase or decrease of the power data output from the microcomputer 70 is stopped. Thus, the power of the laser diode L can be automatically adjusted in accordance with the ambient humidity. The laser scanning can be performed in accordance with the above-mentioned signal VIDEO after the completion of the adjustment.

As can be seen from the foregoing, according to the present invention, it is not necessary to adjust the resistance of the variable resistor $R_M$ as a trimmer, accommodated in the housing of the laser scanner in order to adjust the laser power of the laser diode in accordance with the change in the ambient humidity of the laser printer. This makes it possible for an ordinary user to easily adjust the laser power even after the laser scanner is incorporated in a laser printer or the like without the help of a skilled technician.

Although the D/A converter 40, the humidity data outputting device 50 and the humidity sensor 60 are provided in the illustrated embodiment to constitute a reference voltage adjusting means which varies the second reference voltage $V_{REF2}$ in accordance with the power control digital signal, for example, depending on the ambient humidity of the laser printer having the laser scanner incorporated therein, it is possible instead to provide a volume switch including a variable resistor, so that the second reference voltage $V_{REF2}$ can be adjusted by the operation of the volume switch.

In this alternative, it is possible for a user to adjust and fix an optional laser power to control the print density of the laser printer in accordance with need.

Although the control signal used to increase and decrease the second reference voltage $V_{REF2}$ is realized by the 8 bit digital signal which is converted to an analogue signal by the D/A converter 40 to be input to the operation amplifier 30 in the illustrated embodiment, the control signal can be made of a clock signal. In this alternative, for example, one pulse width of a high level component of the clock signal is decoded before it is input to the operation amplifier 30. Namely, the one pulse width of the high level component of the clock signal is decreased or increased to decrease or increase the second reference voltage $V_{REF2}$ to thereby vary the power of the laser diode L.

Although the above discussion has been directed to a laser scanner in which the power of the laser diode is automatically controlled by a microcomputer 70, the application of the present invention is not limited thereto. For instance, the present invention can be applied to a laser scanner in which the automatic power adjustment of the laser diode is carried out by a sample holding circuit or a peak holding circuit which holds the potential difference representing the laser power.

As can be understood from the above discussion, according to the present invention, since the reference voltage of the laser diode can be adjusted outside of the laser scanner, the laser power can be controlled without actuating the trimmer (variable resistor) of the laser scanner, thus making it possible for an ordinary user to easily adjust the laser power even after the laser scanner is assembled into the laser printer or the like.

We claim:

1. A laser controller, comprising:
   means for emitting a laser beam;
   means for receiving said laser beam emitted by said laser beam emitting means, said receiving means outputting a receipt signal that corresponds to a power level of said laser beam;
   means for outputting a reference signal in accordance with an ambient humidity surrounding said laser controller;
   means for comparing said receipt signal of said light receiving means with said reference signal; and
   means for controlling an output of said laser beam emitting means in accordance with a comparison result of said comparing means.

2. The laser controller of claim 1, wherein said control means controls a power of said laser beam emitted by said laser beam emitting means so as to make said receipt signal of said receiving means coincidental with said reference signal.

3. The laser controller of claim 1, wherein said laser beam emitting means comprises a laser head having a laser diode and a driver that supplies said laser diode with electric current to drive said laser diode.

4. The laser controller of claim 2, wherein said control means varies said power of said laser beam emitted by said laser beam emitting means to make said receipt signal of said receiving means coincidental with said reference signal when said receipt signal of said receiving means is not identical to said reference signal.

5. The laser controller of claim 1, further comprising means for adjusting said output of said laser beam emitting means to a predetermined reference value that is dependent on a reference ambient humidity.

6. The laser controller of claim 5, wherein when an ambient condition shifts from said reference ambient humidity, said reference signal outputting means varies said reference signal in accordance with said shift in ambient condition.

7. The laser controller of claim 6, wherein said controlling means controls said output of said laser beam emitting means so as to make said receipt signal of said receiving means coincidental with said reference signal.

8. The laser controller of claim 7, wherein said controlling means controls said output of said laser beam emitting means prior to a commencement of a laser scanning.

9. The laser controller of claim 1, wherein said reference signal outputting means comprises a humidity sensor for detecting said ambient humidity surrounding said laser controller.

10. The laser controller of claim 9, wherein said reference signal outputting means outputs a reference signal that corresponds to said ambient humidity detected by said humidity sensor.

11. The laser controller of claim 10, wherein said reference signal outputting means outputs reference signals to vary a power level of said laser beam when said ambient humidity detected by said humidity sensor varies from a predetermined reference value.

12. The laser controller of claim 11, wherein said comparing means comprises a comparator to which said reference signal and said receipt signal are inputted.

13. The laser controller of claim 12, wherein said reference signal outputting means outputs said reference signal to vary said power level of said laser beam when said ambient humidity detected by said humidity sensor is higher than said predetermined reference value, and wherein said controlling means increases said power level of said laser beam emitting means until an output of said comparator is inverted.

14. The laser controller of claim 13, wherein said reference signal outputting means outputs said reference signal to decrease said power level of said laser beam when said ambient humidity detected by said humidity sensor is lower than said predetermined reference value, and wherein said controlling means decreases said power level of said laser beam emitting means until an output of said comparator is inverted.

15. An apparatus for controlling an electrophotographic device, comprising:
- a laser that emits a beam of light;
- a photodetector that detects said emitted light beam to obtain a power signal related to a power level of said emitted light beam;
- a humidity sensor that determines an ambient humidity surrounding said laser to obtain a reference signal;
- a comparator that compares said reference signal to said power signal; and
- a controller that controls said power level of said emitted light beam based upon a comparison result of said comparator.

16. The apparatus of claim 15, wherein said reference signal varies in accordance with said ambient humidity determined by said humidity sensor.

17. An apparatus for controlling a printing density of an electrophotographic device, comprising:
- a laser that emits a beam of light;
- means for detecting a power level of said emitted beam of light;
- means for setting a reference signal;
- a comparator that compares said reference signal to said detected power level; and
- a controller that controls said power level of said emitted light beam based upon a comparison result of said comparator to control a print density of said electrophotographic device, wherein said reference signal setting means comprises a humidity sensor that varies said reference signal based upon a detection of an ambient humidity surrounding said laser.

* * * * *